(12) United States Patent
Gupta et al.

(10) Patent No.: US 9,324,451 B2
(45) Date of Patent: Apr. 26, 2016

(54) ALL VOLTAGE, TEMPERATURE AND PROCESS MONITOR CIRCUIT FOR MEMORIES

(71) Applicant: BROADCOM CORPORATION, Irvine, CA (US)

(72) Inventors: Saket Gupta, Minneapolis, MN (US); Yifei Zhang, Edina, MN (US); Carl Monzel, Eagan, MN (US); Mark Jon Winter, Seattle, WA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/534,548

(22) Filed: Nov. 6, 2014

(65) Prior Publication Data

US 2016/0093399 A1    Mar. 31, 2016

Related U.S. Application Data

(60) Provisional application No. 62/055,595, filed on Sep. 25, 2014.

(51) Int. Cl.
G11C 29/44    (2006.01)
G11C 29/04    (2006.01)
G11C 7/12     (2006.01)

(52) U.S. Cl.
CPC  *G11C 29/04* (2013.01); *G11C 7/12* (2013.01); *G11C 29/4401* (2013.01)

(58) Field of Classification Search
CPC ... G11C 11/412; G11C 29/12; G11C 29/4401
USPC ............... 365/194, 189.07, 210.11, 154
See application file for complete search history.

(56) References Cited

U.S. PATENT DOCUMENTS

| 8,146,036 | B1* | 3/2012 | Ren | G01R 31/2894 716/110 |
| 2004/0061561 | A1* | 4/2004 | Monzel | G11C 29/50 331/57 |
| 2014/0015562 | A1* | 1/2014 | Dwivedi | G11C 7/08 324/762.03 |
| 2015/0008987 | A1* | 1/2015 | Bollapalli | H03K 3/0315 331/108 C |
| 2015/0016195 | A1* | 1/2015 | Yu | G11C 7/1084 365/189.05 |

* cited by examiner

*Primary Examiner* — Hoai V Ho
*Assistant Examiner* — Jay Radke
(74) *Attorney, Agent, or Firm* — McDermott Will & Emery LLP

(57) ABSTRACT

A device for monitoring process variations across memory bitcells includes a bitcell inverter that provides an output voltage to be used for identifying skewed corners of the memory bitcells. A first comparator compares the output voltage with a first reference voltage, and a second comparator compares the output voltage with a second reference voltage. The first and the second comparators generate a corner code based on comparison results.

20 Claims, 6 Drawing Sheets

ALL VOLTAGE, TEMPERATURE AND PROCESS MONITOR CIRCUIT FOR MEMORIES

CROSS-REFERENCE TO RELATED APPLICATIONS

This application claims the benefit of priority under 35 U.S.C. §119 from U.S. Provisional Patent Application 62/055,595 filed Sep. 25, 2014, which is incorporated herein by reference in its entirety.

TECHNICAL FIELD

The present description relates generally to memory, and more particularly, but not exclusively, to an all voltage, temperature, and process monitor circuit for memories.

BACKGROUND

Manufacturing process and temperature variations are the cause of variation of characteristics of various devices on a semiconductor chip. For example, memory bitcells of different memory dies of a single wafer may have memory bitcell die-to-die corner variation across the wafer. Currently, monitoring temperature variations and a few process variations of memory dies are performed using logic cells that are created using a separate mask layer than the memory bitcells. For example, one or more assist circuitries implemented using logic cells may receive temperature variations information from a temperature monitor and limited process corners from existing process monitors and provide an adaptive improvement mechanism for memory characteristics such as $V_{CCmin}$, leakage, and other memory characteristics.

The existing logic cell monitors, however, are not able to track bitcell process variations, and more specifically, are not capable of identifying the worst case N and P skewed corners for bitcells. The N and P skewed corners are the process corners that N and P devices have most skewed characteristics. For example, a SF corner, which represents a slow N-device and a fast P-device, and a FS corner, which represents a fast N-device and a slow P-device are the worst case process corners for 6T-bitcells (e.g., memory bitcells having six transistors), and are not distinguishable by the existing logic cell monitors. Further, the existing logic cell monitors do not work for all temperatures or low supply voltages.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In some aspects of the subject disclosure, methods and implementations for monitoring process variations across memory bitcells are described. The subject technology includes a number of advantageous features at circuit, system and product levels. At the circuit level, the disclosed solution is the first process monitor circuit that can track memory bitcells and works across a long range of voltages (e.g., 0.65V-0.95V) and temperatures (e.g., −40° C.-125° C.). The subject device can operate in low-power mode, consumes substantially low chip area, and can take advantage of existing voltage-temperature monitoring (VTMON), while being capable of identifying the worst case FS and SF corners, with negligible impact on local variations. The subject device, however can predict the process corners without VTMON. The system and product advantages include non-reliance on one-time programmable (OTP) based process code storage, which results in cost and power saving. The enabled low-voltage mode (LVM) operation of the subject technology eliminates the need for software components and allows for entirely hardware implementation.

Figure 1:
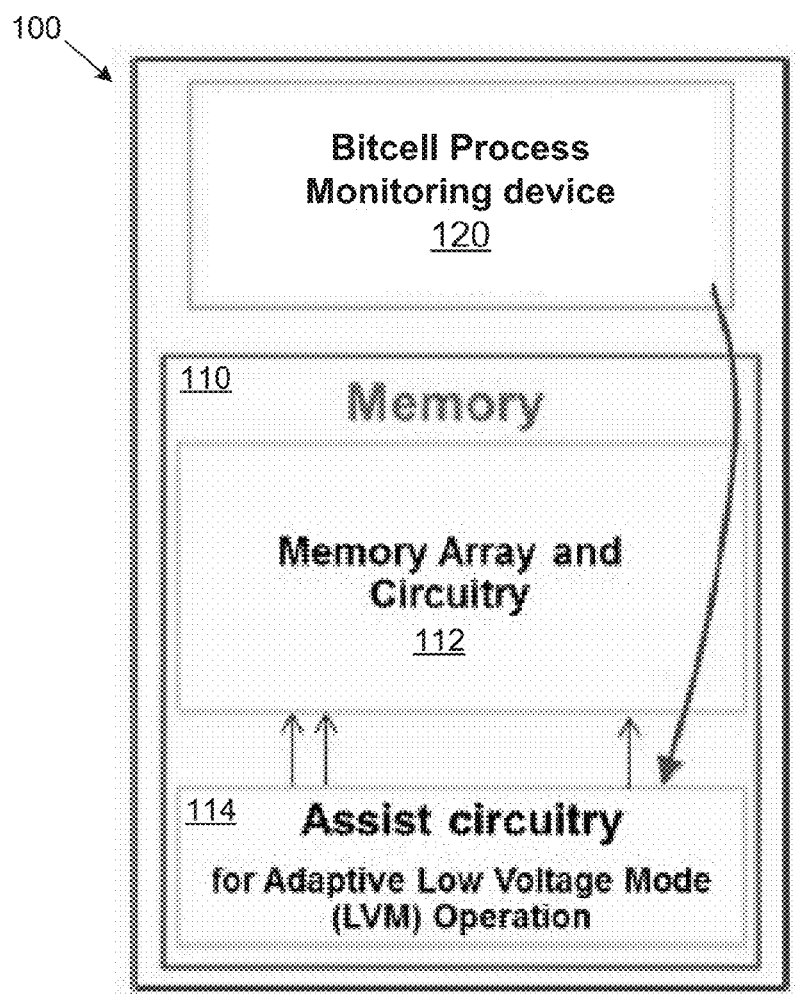
FIG. 1 illustrates a chip including an example of a memory and a device for monitoring process variations across memory bitcells in accordance with one or more implementations.

FIG. 1 illustrates a chip 100 including an example of a memory 110 and a device 120 for monitoring process variations across memory bitcells in accordance with one or more implementations of the subject technology. In one or more implementations, the chip 100 includes the memory 110, and a bitcell process monitoring device 120. Examples of the memory 110 include, but are not limited to, various types of random access memory (RAM) such as static RAM (SRAM) or any other RAM using a 6-T bitcell, register files (RF/SRF), flash memory and any other type of semiconductor memory. The memory 110 includes a memory array and circuitry 112 and an assist circuitry 114. The memory array and circuitry 112, for example, includes an array of memory bitcells and read and write, address, and other control circuitries. Each bitcell can store one bit of information and can be implemented, for instance, in CMOS technology.

The assist circuitry 114 includes suitable logic circuitry and/or code that can be operable to assist in low-voltage mode. The assist circuitry 114 provides for the memory 110 to be able to occasionally operate in low-voltage mode to save power and extend the life-time of the memory 110. In some aspects, the assist circuitry 114 enables low-voltage operation of the memory 110 by changing voltage values at the internal nodes of the memory to lower voltage values. In order to achieve its objectives, the assist circuitry 114 has to receive information regarding speed of memory bitcells, for example, in the form of process variation corners such as FS and SF, which define extreme points of process variation. In one or more aspects, the assist circuitry 114 can use the process and temperature variation information to make the slower bitcells to operate faster or adaptively improve memory VCCmin, leakage, and other features of the memory. In one or more implementations of the subject technology, the process variation information is provided to the assist circuitry 114 by the bitcell process monitoring device 120.

In some aspects, the bitcell process monitoring device 120 provides bitcell process corners of the memory bitcells of the entire memory 110 of the chip 100. An important advantageous feature of the subject technology is provided the process corners using structure of the actual memory bitcells of memory 110. The existing solutions do not use memory bitcells to determine process corners and instead use logic cell monitors, which are structurally different than the memory bitcells and cannot mimic the behavior of the actual memory bitcells. The device 120 is capable of detecting memory bitcell die-to-die corner variations across a single wafer, which is more crucial for large dies. The detection of the corner variations by the device 120 can be performed for all temperatures (e.g., within the range of −40°-125°) and low voltages (e.g., 0.5V-1V), which many existing sensors are incapable of performing. In some implementations, the device 120 includes a bitcell inverter and two comparators as described in more details herein.

Figure 2A:
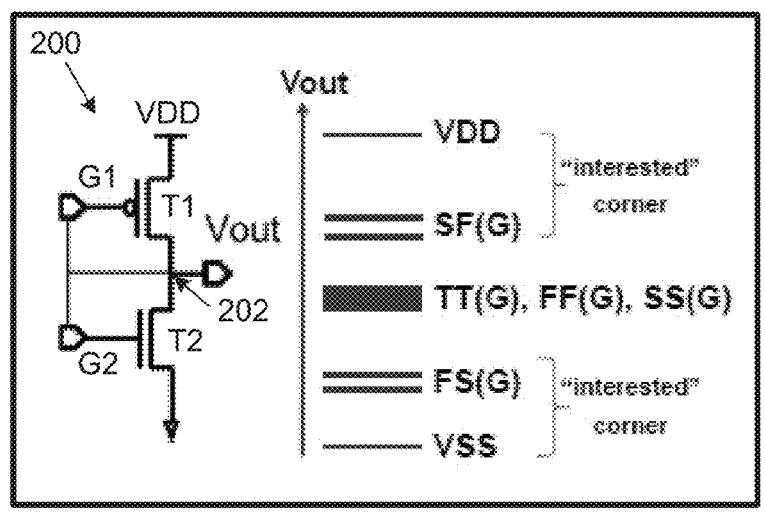
FIG. 2A illustrates an example of bitcell inverter having its output tied to input in accordance with one or more implementations.

FIG. 2A illustrates an example of bitcell inverter 200 having its output tied to its input in accordance with one or more implementations of the subject technology. The bitcell inverter 200 can be a part of the device 120 of FIG. 1. In some implementations, the bitcell inverter 200 includes a first transistor T1 (e.g., a PMOS transistor) and a second transistor T2 (e.g., an NMOS transistor). A gate node G1 of the first transistor T1 is connected to a gate node G2 of the second transistor T2. The gate nodes G1 and G2 are directly coupled to an output node 202, which is at the source and drain nodes of the first and second transistors T1 and T2, respectively. The bitcell inverter 200 is biased at a trip-point of the bitcell NMOS and PMOS of the memory array (e.g., 112 of FIG. 1).

The bitcell inverter 200 provides, at the output node 202, an output voltage Vout that can identify skewed corners of the memory bitcells. Specifically, the output voltage Vout of the bitcell inverter 200 can be used to distinctly identify SF and FS corners from the TT, FF, and SS corners. The first and the second letters of the two-letter nomenclatures (e.g., FS, SF, TT, FF, and SS) used to represent various corners are respectively associated with the N and P devices (e.g., transistors), and S, F, and T respectively denote slow, fast, and typical, and letter G in parenthesis (e.g., FS(G)) denotes global across a die. For example, the SF corner represents a slow N device and a fast P device.

The identification of SF and FS slewed corners is an advantageous feature of the subject technology that is of particular interest because the existing process corner monitors are unable to provide that. As seen in FIG. 2A, while the output voltage values of the bitcell inverter 200 are nearly similar for TT(G), FF(G), and SS(G) corners, the values of the SF(G) and FS(G0) corners are quite distinctly different. This advantageous feature of the bitcell inverter 200 is made possible by forming the bitcell inverter 200 based on the structures taken from an actual memory bitcell, as described below.

Figure 2C:
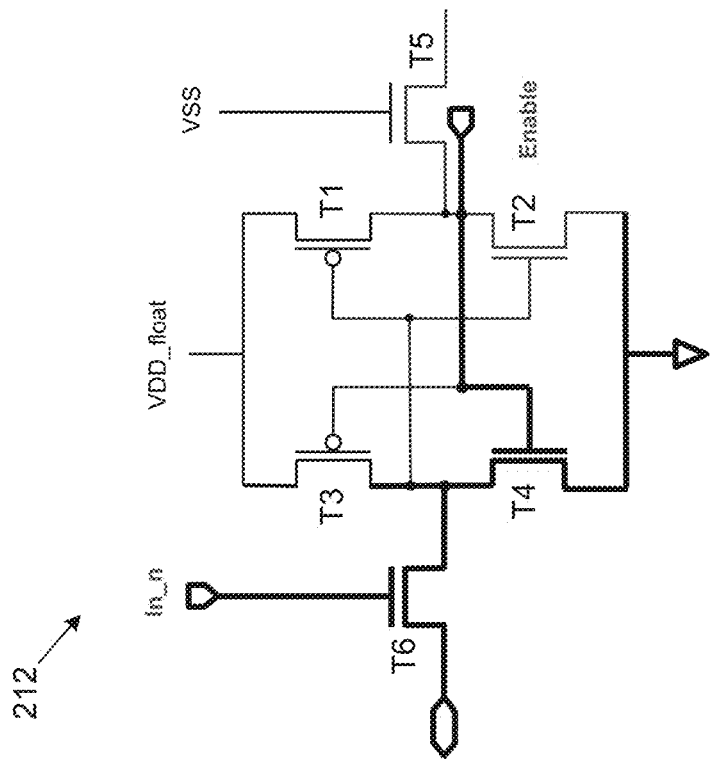
FIGS. 2B and 2C illustrate examples of CMOS memory bitcells, which are used to form the bitcell inverter of FIG. 2A, in accordance with one or more implementations.
Figure 2B:
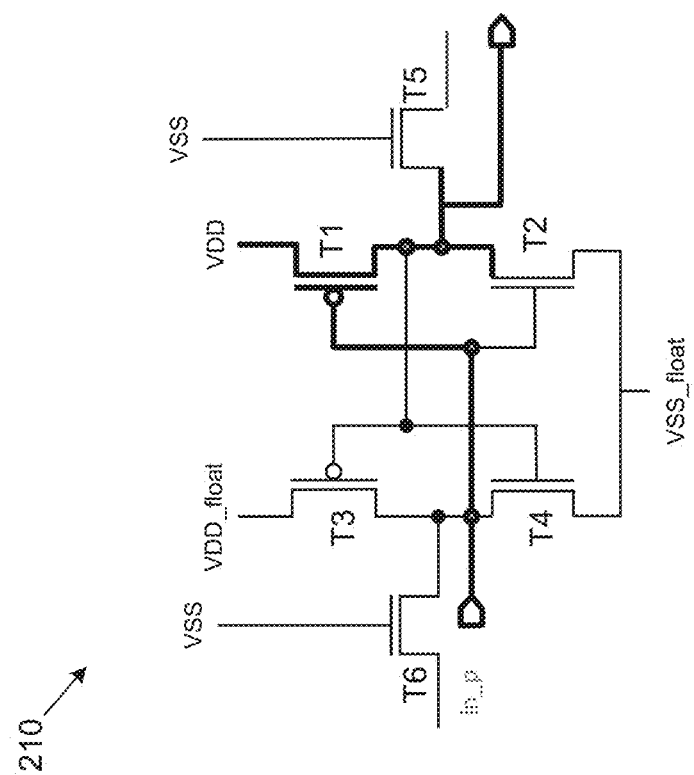

FIGS. 2B and 2C illustrate examples of CMOS memory bitcells 210 and 212, which are used to form the bitcell inverter 200 of FIG. 2A, in accordance with one or more implementations of the subject technology. The bitcell inverter 200 can be advantageously built based on structures taken from a typical bitcell of the memory such as CMOS memory. In some implementations, a first portion of the bitcell inverter 200 (e.g., T1) can be extracted from the CMOS memory bitcell 210 (e.g., a 6T bitcell), which is a known circuit and includes core transistors T1-T4 and pass-gate transistors T5 and T6. The first portion is drawn using thicker lines to clearly distinguish it from the rest of the elements of the CMOS memory bitcell 210. As is seen in FIG. 2B, the gate node of the transistor T1 is connected to the drain node of the transistor T4 to form the p-input (In_p) of the first portion.

A second portion of the bitcell inverter 200 (e.g., T2) can be extracted from the CMOS memory bitcell 212, which is similar to the CMOS memory bitcell 210. The second portion includes pass-gate transistor T6 and the core transistor T4 of the CMOS memory bitcell 212, and is drawn using thicker lines to clearly distinguish it from the rest of the elements of the CMOS memory bitcell 212. As is seen in FIG. 2C, the gate node of the transistor T4 is connected to the drain node of the transistor T2 to form the enable node, and the gate node of transistor T6 is used and the n-input (In_n) of the second portion. The extraction of the first and second portions and the corresponding connection lines are done in a manner that the N and P transistors can be controlled independently in the bitcell and result in changes in only the via connections to word-lines, bit-lines, and other metals without adversely affecting the manufacturing process. In FIGS. 2B and 2C the VDD and VSS are the positive and negative (or zero) bias voltages, respectively, and VDD_float and VSS_float indicate that the corresponding nodes are floating and not connected to any bias voltages.

Figures 3A, 3B:
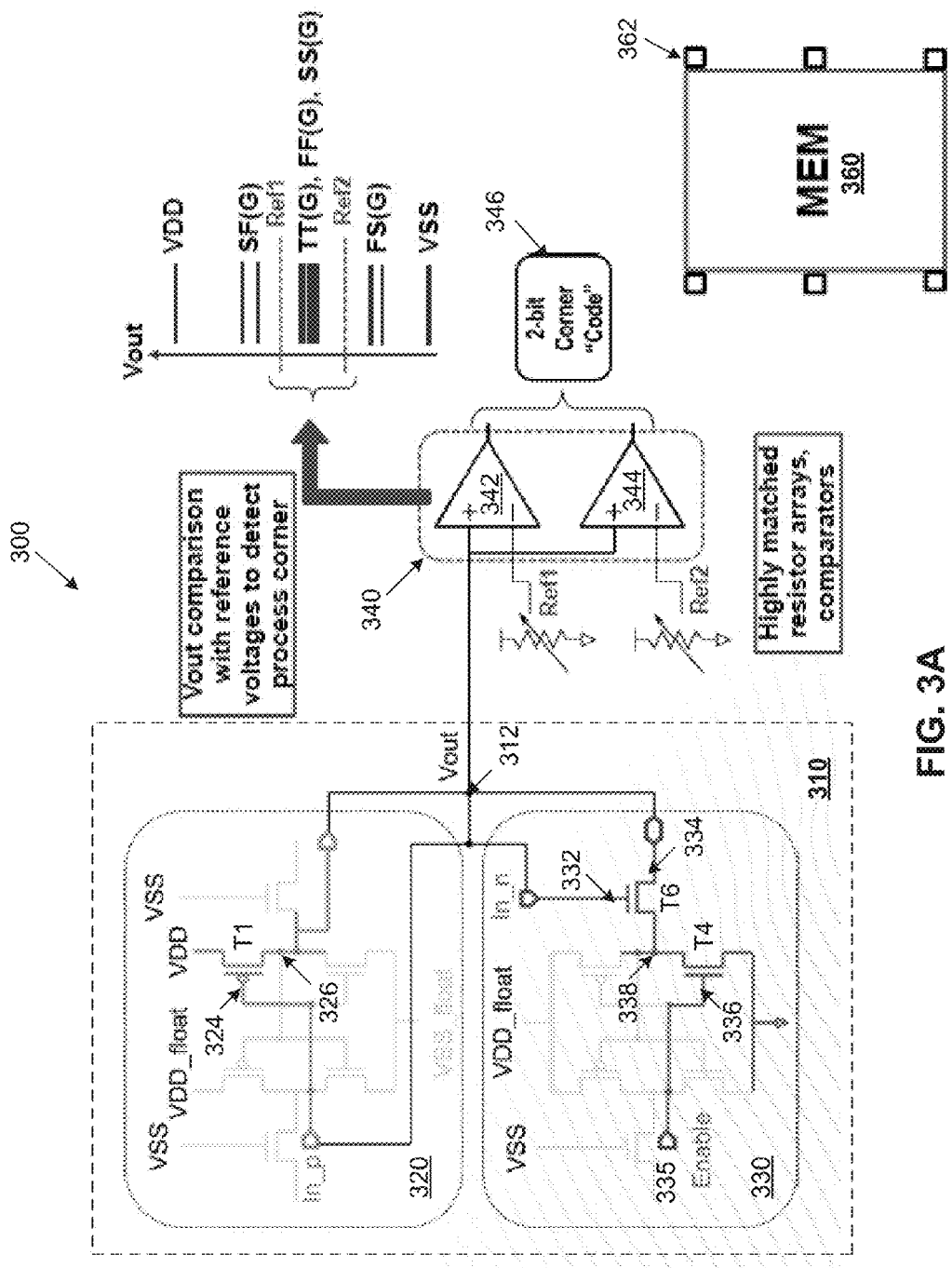
FIGS. 3A and 3B illustrate an example implementation of a device for monitoring process variations across memory bitcells and an example arrangement of sensor cells around a memory chip in accordance with one or more implementations.

FIGS. 3A and 3B illustrate an example implementation of a device 300 for monitoring process variations across memory bitcells and an example arrangement of sensor cells 362 around a memory chip 360 in accordance with one or more implementations of the subject technology. The device 300 includes a bitcell inverter 310, and a comparator block 340 including a first comparator 342, and a second comparator 344. In some implementations, the bitcell inverter 310 includes a first portion 320 of a memory bitcell and a second portion 330 of the memory bitcell. In some aspects, the memory bitcell comprises a CMOS memory bitcell such as the memory bitcell 210 of FIG. 2B or the memory bitcell 212 of FIG. 2C. The first portion 320, which is extracted from the memory bitcell 210, includes the PMOS transistor T1, and the second portion 330, which is extracted from the memory bitcell 212, includes the NMOS transistors T4 and T6.

In one or more implementations, the bitcell inverter 310 is formed by coupling a gate node 324 of the PMOS transistor T1 to a gate node 332 of the NMOS transistor T6. In the example bitcell inverter 310, the PMOS transistor T1 is a pull-up PMOS transistor of the CMOS memory bitcell 210 and the NMOS transistor T6 is a pass-gate NMOS transistor of the CMOS memory bitcell 212. The output voltage Vout of the bitcell inverter 310 is taken at node 312, which connects the source node 326 of the PMOS transistor T1 to the drain node 334 of the pass-gate transistor T6 and is also connected to the gate node 326 of the first PMOS transistor T1. A suitable enable signal 335 applied to the gate node 336 of the NMOS transistor T4 can turn this transistor on to provide a path to the ground for the source node 338 of NMOS transistor T6, thereby enabling the bitcell inverter 310. In some aspects, the bitcell inverter 310 is biased at a trip-point of the CMOS memory bitcell (e.g., 210 or 212).

In some aspects, the first comparator 342 and the second comparator 344 compare the output voltage Vout of the bitcell inverter 310 with a first reference voltage Vref1 and a second reference voltage Vref2, respectively. In the example shown in FIG. 3A, the first reference voltage Vref1 is greater than the second reference voltage Vref2. The first comparator 342 and the second comparator 344 generate a corner code 346 (e.g., a 2-bit code) based on the comparison results. For example, the first and the second comparators 342 and 344 generate a code (e.g., corner code 346) that corresponds to a SF corner (e.g., SF(G)) when the output voltage Vout is greater than the first reference voltage Vref1, and generate a separate code (e.g., corner code 346) that corresponds to a FS corner (e.g., FS(G)) when the output voltage is smaller than the second reference voltage Vref2. The corner code 346 is provided to an adaptive assist circuit as discussed in more detail herein.

FIG. 3B shows the arrangement of sensor cells 362 on the memory chip 360. In some implementations, each sensor cell 362 includes a number of (e.g., N, such as 200-400) bitcell inverters (e.g., 310) that can share one set of comparators (e.g., 342 and 344) that compare an average value of the output voltages of the N bitcell inverters with the reference voltages Vref1 and Vref2 and generate a corresponding corner code. The corresponding corner code can distinctly differentiate between the global corners FS(G) and SF(G) of memory bitcells of the memory chip 360.

Figure 4:
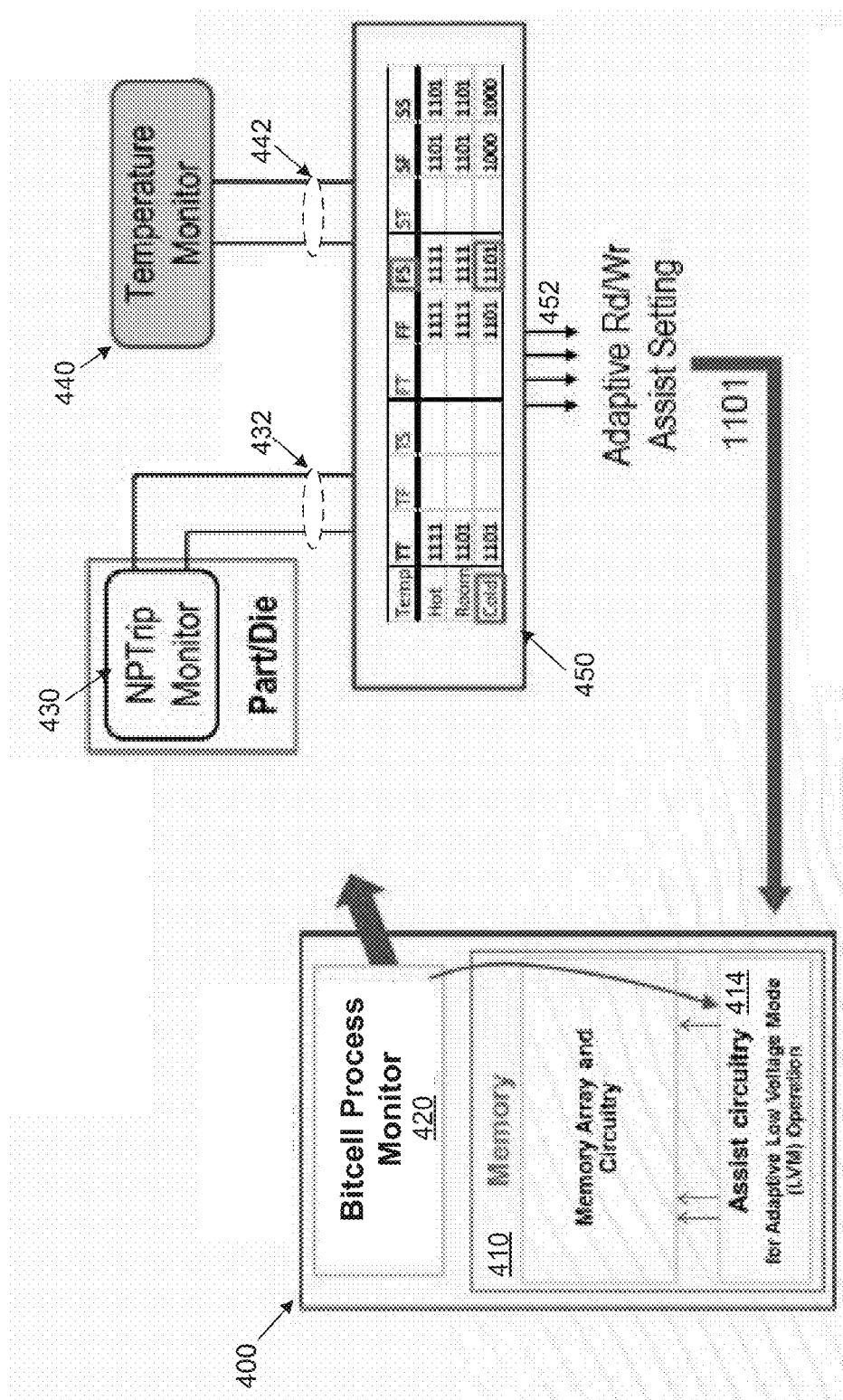
FIG. 4 illustrates an example application of a device for monitoring process variations across memory bitcells in accordance with one or more implementations.

FIG. 4 illustrates an example application of a device 420 for monitoring process variations across memory bitcells in accordance with one or more implementations of the subject technology. The chip 400 is similar to the chip 100 of FIG. 1 and includes the device 420 that can provide suitable process variation information to the assist circuitry 414. In some aspects, the device 420 includes one or more NP trip monitors 430 that can provide a process corner code 432. Examples of the NP trip monitor 430 includes the device 300 of FIG. 3A. Process corner code 342 generated by the NP trip monitor 430 and a temperature code 442 generated by a temperature monitor 440 are provided through a table 450 to the assist circuitry 414. In some aspects, the table 450 corresponds to an adaptive assist circuit that can be implemented by a combinational logic circuit. The adaptive assist circuit provides an adaptive assist setting output 452 (e.g., a four-bit code) to the memory assist circuitry 414 that is enabled for low-voltage mode (LVM) operation. For example, the adaptive assist setting output 452 can be a code 1101 that corresponds to an FS process corner and a cold temperature corner.

In some implementations, the assist circuitry 414 is similar to the assist circuitry 114 of FIG. 1 and can improve or change configuration of the memory 410 or provide for the memory 410 to be able to occasionally operate in low-voltage mode to save power and extend the life-time of the memory 410. In some aspects, the assist circuitry 414 can enable low-voltage operation of the memory 410 by changing voltage values at the internal nodes of the memory to lower voltage values.

Figure 5:
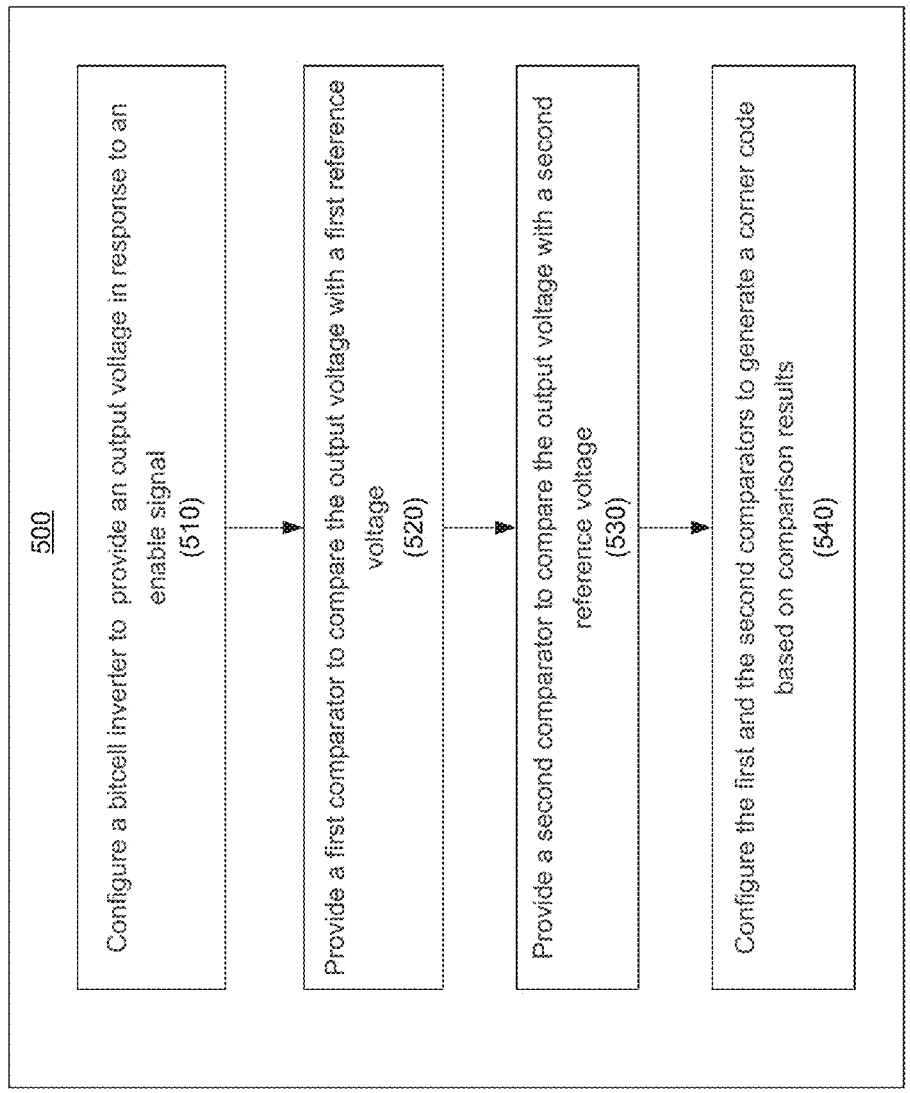
FIG. 5 illustrates an example of a method for monitoring process variations across memory bitcells in accordance with one or more implementations.

FIG. 5 illustrates an example of a method 500 for monitoring process variations across memory bitcells in accordance with one or more implementations of the subject technology. For explanatory purposes, the example method 500 is described herein with reference to, but is not limited to, the process disclosed with respect to the device 300 of FIG. 3A. Further, for explanatory purposes, the blocks of the example method 500 are described herein as occurring in serial, or linearly. However, multiple blocks of the example method 500 can occur in parallel. In addition, the blocks of the example method 500 need not be performed in the order shown and/or one or more of the blocks of the example method 500 need not be performed.

According to the method 500, a bitcell inverter (e.g., 310 of FIG. 3A) provides an output voltage (e.g., Vout of FIG. 3A) in response to an enable signal (e.g., 335 of FIG. 3A) (510). A first comparator (e.g., 342 of FIG. 3A) is provided that compares the output voltage with a first reference voltage (e.g., Vref1 of FIG. 3A) (520). A second comparator (e.g., 344 of FIG. 3A) compares the output voltage with a second reference voltage (e.g., Vref2 of FIG. 3A) (530). The first and the second comparators generate a corner code (e.g., 346 of FIG. 3A) based on comparison results (540). The corner code can be used for identifying skewed corners (e.g., SF(G) and FS(G) of FIG. 3A) of the memory bitcells (e.g., of memory 360 of FIG. 3B).

Figure 6:
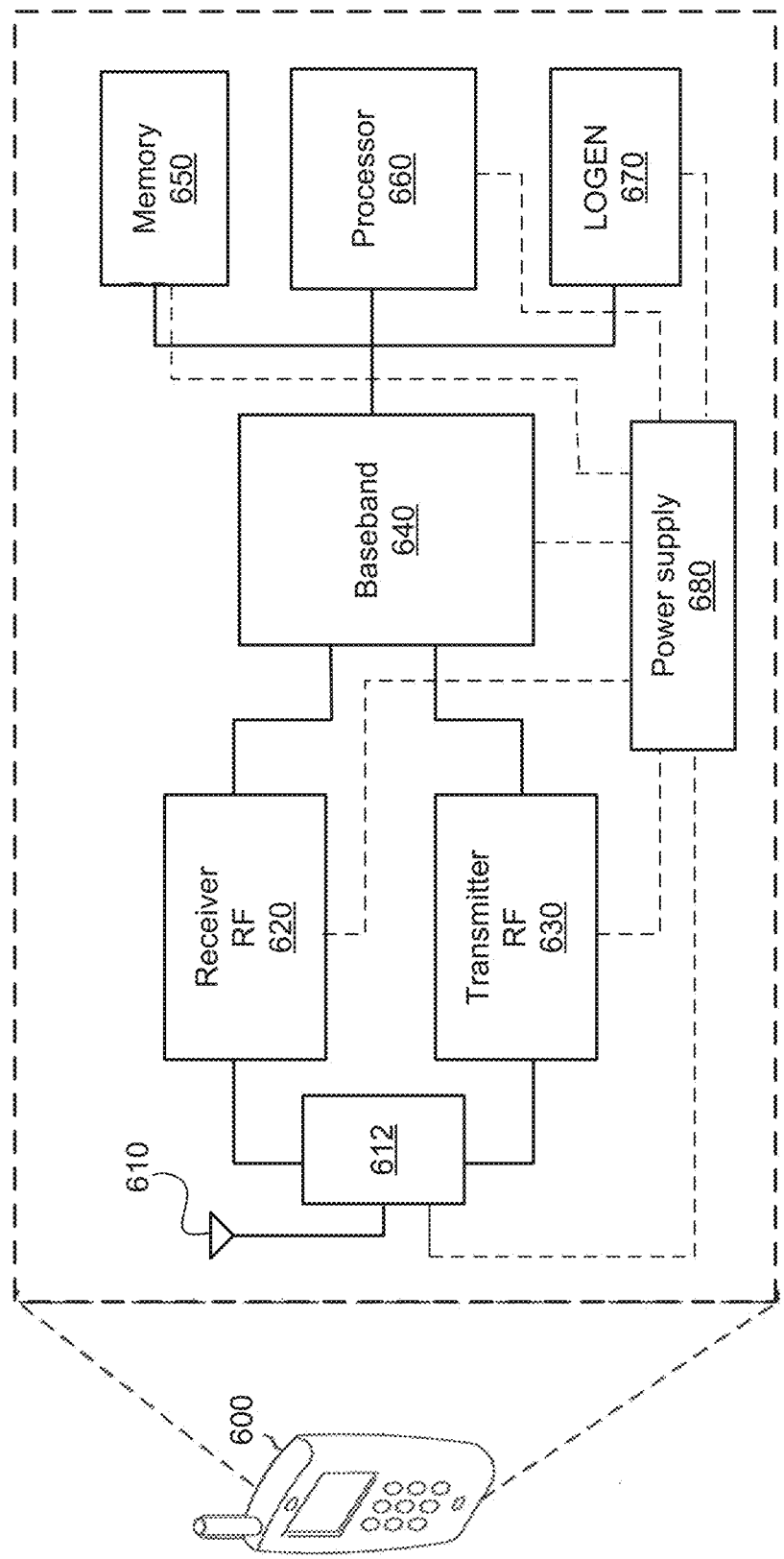
FIG. 6 illustrates an example of a wireless communication device employing features of the subject technology in accordance with one or more implementations.

FIG. 6 illustrates an example of a wireless communication device 600 employing features of the subject technology in accordance with one or more implementations of the subject technology. The wireless communication device 600 includes a radio-frequency (RF) antenna 610, a receiver 620, a transmitter 630, a baseband processing module 640, a memory 650, a processor 460, a local oscillator generator (LOGEN) 670, and a power supply 680. In various embodiments of the subject technology, one or more of the blocks represented in FIG. 6 can be integrated on one or more semiconductor substrates. For example, the blocks 620-670 can be realized in a single chip or a single system on chip, or can be realized in a multi-chip chipset.

The RF antenna 610 can be suitable for transmitting and/or receiving RF signals (e.g., wireless signals) over a wide range of frequencies. Although a single RF antenna 610 is illustrated, the subject technology is not so limited.

The receiver 620 comprises suitable logic circuitry and/or code that can be operable to receive and process signals from the RF antenna 610. The receiver 620 may, for example, be operable to amplify and/or down-convert received wireless signals. In various embodiments of the subject technology, the receiver 620 is operable to cancel noise in received signals and can be linear over a wide range of frequencies. In this manner, the receiver 620 is suitable for receiving signals in accordance with a variety of wireless standards. Wi-Fi, WiMAX, Bluetooth, and various cellular standards.

The transmitter 630 comprises suitable logic circuitry and/or code that can be operable to process and transmit signals from the RF antenna 610. The transmitter 630 may, for example, be operable to up-convert baseband signals to RF signals and amplify RF signals. In various embodiments of the subject technology, the transmitter 630 is operable to up-convert and to amplify baseband signals processed in accordance with a variety of wireless standards. Examples of such standards include Wi-Fi, WiMAX, Bluetooth, and various cellular standards. In various embodiments of the subject technology, the transmitter 630 is operable to provide signals for further amplification by one or more power amplifiers.

In some implementations, the transmitter 630 includes an RF power amplifier that can be a high-voltage power amplifier fabricated using the LDMOS device (e.g. as shown in FIG. 1A or 1C) of the subject technology.

The duplexer 612 provides isolation in the transmit band to avoid saturation of the receiver 620 or damaging parts of the receiver 620, and to relax one or more design requirements of the receiver 620. Furthermore, the duplexer 612 can attenuate the noise in the receive band. The duplexer is operable in multiple frequency bands of various wireless standards.

The baseband processing module 640 comprises suitable logic, circuitry, interfaces, and/or code that can be operable to perform processing of baseband signals. The baseband processing module 640 may, for example, analyze received signals and generate control and/or feedback signals for configuring various components of the wireless communication device 600 such as the receiver 620. The baseband processing module 640 is operable to encode, decode, transcode, modulate, demodulate, encrypt, decrypt, scramble, descramble, and/or otherwise process data in accordance with one or more wireless standards.

The processor 660 comprises suitable logic, circuitry, and/or code that can enable processing data and/or controlling operations of the wireless communication device 600. In this regard, the processor 660 is enabled to provide control signals to various other portions of the wireless communication device 600. The processor 660 can also control transfers of data between various portions of the wireless communication device 600. Additionally, the processor 660 can enable implementation of an operating system or otherwise execute code to manage operations of the wireless communication device 600.

The memory 650 comprises suitable logic, circuitry, and/or code that can enable storage of various types of information such as received data, generated data, code, and/or configuration information. The memory 650 includes, for example, RAM, ROM, flash, and/or magnetic storage. In various embodiment of the subject technology, the memory 650 may include a RAM, DRAM, SRAM, T-RAM, Z-RAM, TTRAM, or any other storage media.

In some implementations, the memory 650 includes a memory chip (e.g., 400 of FIG. 4) including a bitcell process monitor (e.g., 420 of FIG. 4) that provides process variation information including process corners to an assist circuitry (e.g., 414 of FIG. 4) of the memory chip. The assist circuitry can use the process corners as well as temperature corners provided by a temperature monitor to improve performance of the memory 650, for example, by enabling low-voltage mode of operation of the memory 650, which results in lower power consumption and longer lifetime of the memory 650.

The local oscillator generator (LOG EN) 670 comprises suitable logic, circuitry, interfaces, and/or code that can be operable to generate one or more oscillating signals of one or more frequencies. The LOGEN 670 can be operable to generate digital and/or analog signals. In this manner, the LOGEN 670 can be operable to generate one or more clock signals and/or sinusoidal signals. Characteristics of the oscillating signals such as the frequency and duty cycle can be determined based on one or more control signals from, for example, the processor 660 and/or the baseband processing module 640.

In operation, the processor 660 can configure the various components of the wireless communication device 600 based on a wireless standard according to which it is desired to receive signals. Wireless signals can be received via the RF antenna 610 and amplified and down-converted by the receiver 620. The baseband processing module 640 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 650, and/or information affecting and/or enabling operation of the wireless communication device 600. The baseband processing module 640 can modulate, encode and perform other processing on audio, video, and/or control signals to be transmitted by the transmitter 630 in accordance to various wireless standards.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device for monitoring process variations across memory bitcells, the device comprising:
 a bitcell inverter configured to provide an output voltage to be used for identifying skewed corners of the memory bitcells;
 a first comparator configured to compare the output voltage with a first reference voltage; and
 a second comparator configured to compare the output voltage with a second reference voltage,
 wherein the first and the second comparators are configured to generate a corner code based on comparison results, and wherein the first reference voltage is greater than the second reference voltage.

2. The device of claim 1, wherein the bitcell inverter comprises a first portion of a memory bitcell and a second portion of the memory bitcell.

3. The device of claim 2, wherein the memory bitcells comprise CMOS memory bitcells, and wherein the first portion comprises a PMOS transistor and the second portion comprises an NMOS transistor.

4. The device of claim 3, wherein the bitcell inverter is configured by coupling a gate node of the PMOS transistor to a gate node of the NMOS transistor.

5. The device of claim 3, wherein the PMOS transistor comprises a pull-up PMOS transistor of the CMOS memory bitcell and the NMOS transistor comprises a pass-gate NMOS transistor of the CMOS memory bitcell.

6. The device of claim 1, wherein the bitcell inverter is biased at a trip-point of a CMOS memory bitcell.

7. The device of claim 1, wherein the first and the second comparators are configured to generate a code corresponding to a SF corner when the output voltage is greater than the first reference voltage.

8. The device of claim 1, wherein the first and the second comparators are configured to generate a code corresponding to a FS corner when the output voltage is smaller than the second reference voltage.

9. The device of claim 1, wherein the corner code is provided to an adaptive assist circuit that provides an adaptive assist setting output to a memory assist circuit, and wherein the device is configured to enable the adaptive assist circuit in a low-voltage mode (LVM) operation.

10. A method for monitoring process variations across memory bitcells, the method comprising:
 configuring a bitcell inverter to provide an output voltage in response to an enable signal;
 providing a first comparator that is configured to compare the output voltage with a first reference voltage;
 providing a second comparator that is configured to compare the output voltage with a second reference voltage; and
 configuring the first and the second comparators to generate a corner code based on comparison results,
 wherein the corner code is configured to be used for identifying skewed corners of the memory bitcells, and wherein the first reference voltage is greater than the second reference voltage.

11. The method of claim 10, wherein the bitcell inverter comprises a first portion of a memory bitcell and a second portion of the memory bitcell of a memory chip.

12. The method of claim 11, wherein the memory bitcells comprise CMOS memory bitcells, and wherein the first portion comprises a PMOS transistor and the second portion comprises an NMOS transistor.

13. The method of claim 12, wherein configuring the bitcell inverter comprises coupling a gate node of the PMOS transistor to a gate node of the NMOS transistor.

14. The method of claim 12, wherein coupling the gate node of the PMOS transistor to the gate of the NMOS transistor comprises coupling a pull-up PMOS transistor of the CMOS memory bitcell to the gate node of the NMOS transistor, and wherein the NMOS transistor comprises a pass-gate NMOS transistor of the CMOS memory bitcell.

15. The method of claim 10, wherein configuring biasing the bitcell inverter comprises biasing the bitcell inverter at a trip-point of a CMOS memory bitcell.

16. The method of claim 10, and wherein the method further comprising configuring the first and the second comparators to generate a code corresponding to a SF corner when the output voltage is greater than the first reference voltage.

17. The method of claim 10, further comprising configuring the first and the second comparators to generate a code corresponding to a FS corner when the output voltage is smaller than the second reference voltage.

18. The method of claim 10, further comprising providing the corner code to an adaptive assist circuit that provides an adaptive assist setting output to a memory assist circuit, and enabling the adaptive assist circuit in a low-voltage mode (LVM) operation.

19. A communication device, comprising:
 memory comprising memory bitcells; and
 a device for monitoring process variations across the memory bitcells, the device comprising:
  a bitcell inverter configured to provide an output voltage in response to an enable signal;
  a first comparator configured to compare the output voltage with a first reference voltage; and
  a second comparator configured to compare the output voltage with a second reference voltage,
  wherein the first and the second comparators are configured to generate a corner code based on comparison results, and wherein the corner code is configured to be used for identifying skewed corners of the memory bitcells, and wherein the first reference voltage is greater than the second reference voltage.

20. The communication device of claim 19, wherein:
 the memory bitcells comprise CMOS memory bitcells,
 the bitcell inverter comprises a first portion of a memory bitcell and a second portion of the memory bitcell, the first portion comprises a PMOS transistor and the second portion comprises an NMOS transistor,
the bitcell inverter is configured by coupling a gate node of the PMOS transistor to a gate of the NMOS transistor,
the PMOS transistor comprises a pull-up PMOS transistor of the CMOS memory bitcell and the NMOS transistor comprises a pass-gate NMOS transistor of the CMOS memory bitcell, and
the bitcell inverter is biased at a trip-point of a CMOS memory bitcell.

* * * * *